United States Patent [19]
Graf et al.

[11] Patent Number: 6,135,128
[45] Date of Patent: Oct. 24, 2000

[54] METHOD FOR IN-PROCESS CLEANING OF AN ION SOURCE

[75] Inventors: Michael A. Graf, Cambridge; Victor M. Benveniste, Gloucester, both of Mass.

[73] Assignee: Eaton Corporation, Cleveland, Ohio

[21] Appl. No.: 09/049,642

[22] Filed: Mar. 27, 1998

[51] Int. Cl.[7] .............................. B08B 3/12; C23F 1/02; G01N 21/01; H01J 27/00
[52] U.S. Cl. .......................... 134/1.1; 156/345; 250/431; 250/423 R
[58] Field of Search ............................ 134/1.1; 156/345; 250/431, 423 R

[56] References Cited

U.S. PATENT DOCUMENTS

| | | | |
|---|---|---|---|
| 4,818,326 | 4/1989 | Liu et al. | 156/345 |
| 5,413,670 | 5/1995 | Langan et al. | 134/1.2 |
| 5,421,902 | 6/1995 | Odajima et al. | 134/19 |
| 5,421,957 | 6/1995 | Carlson et al. | 216/58 |
| 5,620,526 | 4/1997 | Watatani et al. | 134/1.1 |
| 5,812,403 | 9/1998 | Fong et al. | 364/468.28 |

*Primary Examiner*—Randy Gulakowski
*Assistant Examiner*—Yolanda E. Wilkins
*Attorney, Agent, or Firm*—John A. Kastelic

[57] ABSTRACT

A method and system for in-process cleaning of an ion source (12) is provided. The ion source (12) comprises (i) a plasma chamber (22) formed by chamber walls (112, 114, 116) that bound an ionization zone (120); (ii) a source of ionizable dopant gas (66) and a first mechanism (68) for introducing said ionizable dopant gas into said plasma chamber; (iii) a source of cleaning gas (182) and a second mechanism (184) for introducing said cleaning gas into said plasma chamber; and (iv) an exciter (130) at least partially disposed within said chamber for imparting energy to said ionizable dopant gas and said cleaning gas to create a plasma within said plasma chamber. The plasma comprises disassociated and ionized constituents of said dopant gas and disassociated and ionized constituents of said cleaning gas. The disassociated and ionized constituents of said cleaning gas react with said disassociated and ionized constituents of said dopant gas to prevent formation of deposits of elements contained within said ionizable dopant gas on surfaces of said chamber walls. The cleaning gas may be, for example, nitrogen trifluoride ($NF_3$), and the ionizable dopant gas may be, for example, either phosphine ($PH_3$) or arsine ($AsH_3$). Mass flow controllers control the ratio of cleaning gas to ionizable dopant gas introduced into said plasma chamber, which is greater than 0:1 and preferably at least 3:1.

10 Claims, 5 Drawing Sheets

METHOD FOR IN-PROCESS CLEANING OF AN ION SOURCE

FIELD OF THE INVENTION

The present invention relates generally to the field of ion implanters, and more specifically to an improved system and method for in-process cleaning of a cold wall ion source.

BACKGROUND OF THE INVENTION

Ion implantation has become the technology preferred by industry to dope semiconductors with impurities in the large-scale manufacture of integrated circuits. Ion dose and ion energy are the two most important variables used to define an implant step. Ion dose relates to the concentration of implanted ions for a given semiconductor material. Typically, high current implanters (generally greater than 10 milliamps (mA) ion beam current) are used for high dose implants, while medium current implanters (generally capable of up to about 1 mA beam current) are used for lower dose applications.

Ion energy is the dominant parameter used to control junction depth in semiconductor devices. The energy levels of the ions which make up the ion beam determine the degree of depth of the implanted ions. High energy processes such as those used to form retrograde wells in semiconductor devices require implants of up to a few million electron volts (MeV), while shallow junctions may only demand ultra low energy (ULE) levels below one thousand electron volts (1 KeV).

A typical ion implanter comprises three sections or subsystems: (i) an ion source for outputting an ion beam, (ii) a beamline including a mass analysis magnet for mass resolving the ion beam, and (iii) a target chamber which contains the semiconductor wafer or other substrate to be implanted by the ion beam. The continuing trend toward smaller and smaller semiconductor devices requires a beamline construction which serves to deliver high beam currents at low energies. The high beam current provides the necessary dosage levels, while the low energy permits shallow implants. Source/drain junctions in semiconductor devices, for example, require such a high current, low energy application.

Ion sources in ion implanters typically generate an ion beam by ionizing within a source chamber a source gas, a component of which is a desired dopant element, and extracting the ionized source gas in the form of an ion beam. The ionization process is effected by an exciter which may take the form of a thermally heated filament or a radio frequency (RF) antenna. A thermally heated filament thermionically emits high-energy electrons while an RF antenna delivers a high energy RF signal into the source chamber. An example of a high current, low energy ion source is shown in U.S. Pat. No. 5,661,308 to Benveniste, et al., commonly owned by the assignee of the present invention and incorporated by reference as if fully set forth herein.

Either the high-energy electrons (in the case of the thermally heated exciter) or the RF signal (in the case of the RF exciter) is used to impart energy to, and thus ionize, the source gas in the source chamber. Examples of desired dopant elements of which the source gas is comprised include phosphorous (P) or arsenic (As). In an ion source utilizing a thermally heated filament for ionization, the source chamber typically attains temperatures on the order of 1000° C. Temperatures such as this (greater than 400° C.) are usually sufficient to prevent the formation of phosphorous or arsenic deposits on the interior walls of the source chamber. In an ion source utilizing an RF antenna, however, the operational temperatures of the source chamber are typically much lower, on the order of 50° C. Such RF excited sources are often referred to as "cold wall" sources. As a result, the interior walls of the ion source chamber may be contaminated by the formation of phosphorous or arsenic deposits during operation.

Because ion implanters are operated using a variety of process recipes, different types of source gases are run in the source to obtain ion beams comprising the desired dopant ions. If, however, the source chamber walls are contaminated by deposit formation during a previous process recipe (e.g., one involving phosphorous), a later process recipe (e.g., one involving arsenic) may be adversely effected by this cross-contamination. Accordingly, during equipment downtimes between process recipes, it is necessary to remove the accumulated deposit formations from the source chamber interior walls to minimize the risk of contaminating subsequent process recipes.

It is known to clean a plasma treatment chamber using a cleaning gas such as nitrogen trifluoride ($NF_3$) (see, e.g., U.S. Pat. No. 5,620,526 to Watatani et al.) Such cleaning may be conducted in-situ, without disassembling the ion source. However, in-situ cleaning of an ion source chamber between processes wastes valuable time during which the ion implanter is not being used to make product.

Accordingly, it is an object of the present invention to provide an ion source which provides the capability for in-process cleaning of the source chamber while the ion implanter is operational. It is a further object of the invention to provide a method for achieving such in-process cleaning of an ion source.

SUMMARY OF THE INVENTION

A method and system for in-process cleaning of an ion source is provided. The ion source comprises (i) a plasma chamber formed by chamber walls that bound an ionization zone; (ii) a source of ionizable dopant gas and a first mechanism for introducing the ionizable dopant gas into the plasma chamber; (iii) a source of cleaning gas and a second mechanism for introducing the cleaning gas into the plasma chamber; and (iv) an exciter at least partially disposed within the chamber for imparting energy to the ionizable dopant gas and the cleaning gas to create a plasma within the plasma chamber.

The plasma comprises disassociated and ionized constituents of the dopant gas and disassociated and ionized constituents of the cleaning gas. The disassociated and ionized constituents of the cleaning gas react with the disassociated and ionized constituents of the dopant gas to prevent formation of deposits of elements contained within the ionizable dopant gas on surfaces of the chamber walls. The cleaning gas may be nitrogen trifluoride ($NF_3$), and the ionizable dopant gas may be either phosphine ($PH_3$) or arsine ($AsH_3$). Mass flow controllers control the ratio of cleaning gas to ionizable dopant gas introduced into the plasma chamber, which is greater than 0:1 and preferably at least 3:1.

DETAILED DESCRIPTION OF A PREFERRED EMBODIMENTS

Figure 1:
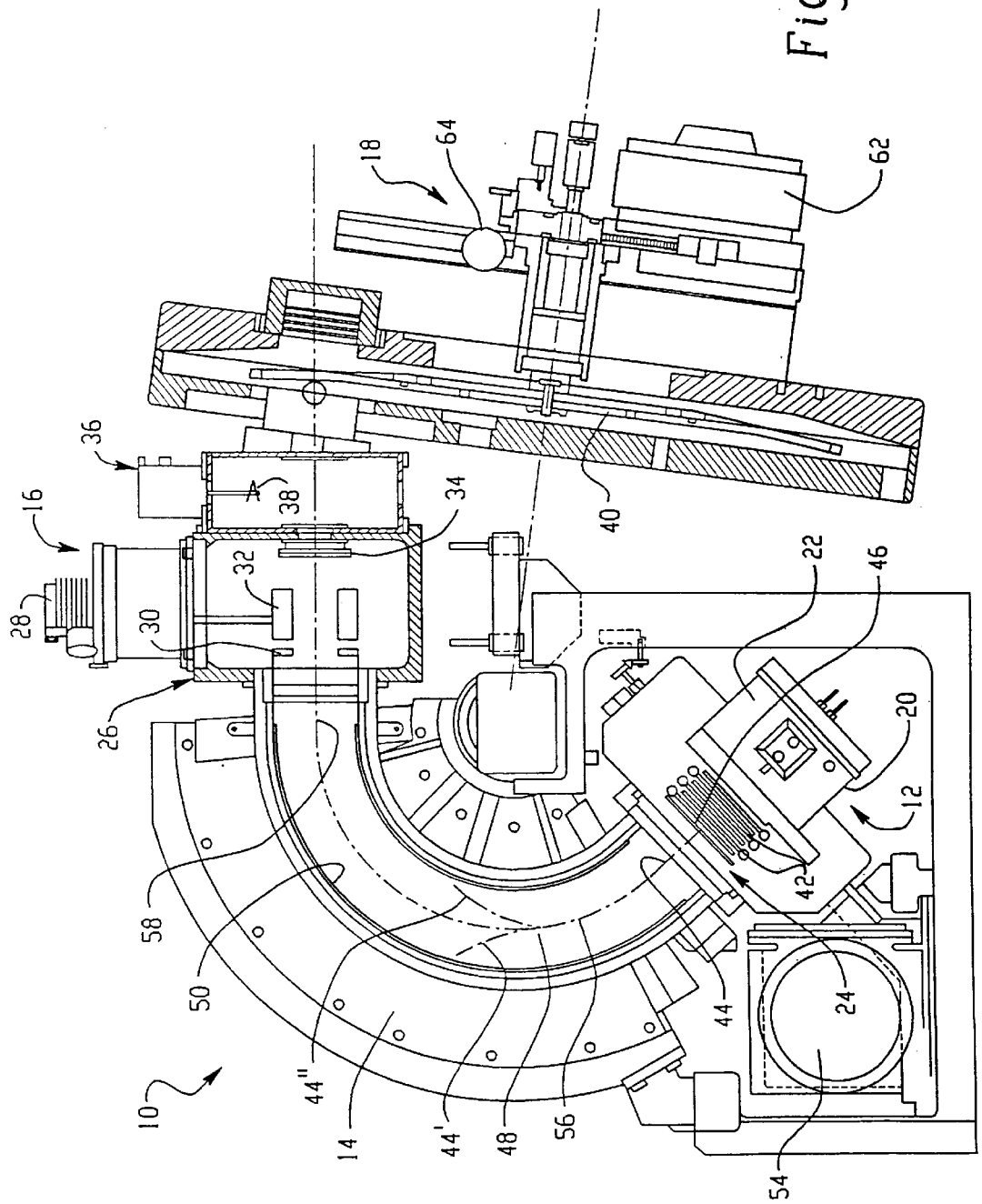
FIG. 1 is a perspective view of an ion implantation system into which is incorporated one embodiment of an ion source constructed according to the principles of the present invention.

Referring now to the drawings, FIG. 1 discloses an ion implanter, generally designated 10, which comprises an ion source 12, a mass analysis magnet 14, a beamline assembly 16, and a target or end station 18. One application of the present invention is in a low energy implanter, such as that shown in FIG. 1, wherein the beamline assembly 16 is relatively short due to the tendency of a low energy beam to expand (i.e., "blow-up") during propagation thereof.

The ion source 12 comprises a housing 20 which defines a plasma chamber 22, and an ion extractor assembly 24. The beamline assembly 16 includes (i) a resolver housing 26 which is evacuated by vacuum pump 28 and which contains a terminal aperture 30, a resolving aperture 32, and a flag Faraday 34; and (ii) a beam neutralizer 36 which contains an electron shower 38, none of which form a part of the present invention. Downstream of the beam neutralizer 36 is the end station 18, which includes a disk-shaped wafer support 40 upon which wafers to be treated are mounted. As used herein, wafer shall include any type of substrate, which may be implanted with an ion beam.

Energy is imparted to the ionizable dopant gas to generate ions within the plasma chamber 22. Generally, positive ions are generated, although the present invention is applicable to systems wherein negative ions are generated by the source. The positive ions are extracted through a slit in the plasma chamber 22 by the ion extractor assembly 24 which comprises a plurality of electrodes 42. Accordingly, the ion extractor assembly functions to extract a beam 44 of positive ions from the plasma chamber through an extraction aperture plate 46 and accelerate the extracted ions toward the mass analysis magnet 14.

The mass analysis magnet 14 functions to pass only ions of an appropriate charge-to-mass ratio to the beamline assembly 16. The mass analysis magnet 14 includes a curved beam path 48 which is defined by an aluminum beam guide 50 connected to the source 12, evacuation of which is provided by a vacuum pumps 28 and 54. The ion beam 44 that propagates along this path is affected by the magnetic field generated by the mass analysis magnet 14. The magnetic field causes the ion beam 44 to move along the curved beam path 48, from a first or entrance trajectory 56 near the ion source 12 to a second or exit trajectory 58 near the resolving housing 26. Portions 44' and 44" of the beam 44 comprised of ions having an inappropriate charge-to-mass ratio are deflected away from the curved trajectory and into the walls of aluminum beam guide 50. In this manner, the magnet 14 passes to the beamline assembly 16 only those ions in the beam 44 that have the desired charge-to-mass ratio.

The disc shaped wafer support 40 at the end station 18 is rotated by motor 62. As is known in the art, the disk shaped support 40 is rotated at a constant angular velocity by motor 62, and support 40 is moved vertically (into and out of the page of FIG. 1) by motor 64 and a lead screw (not shown).

Figure 2:
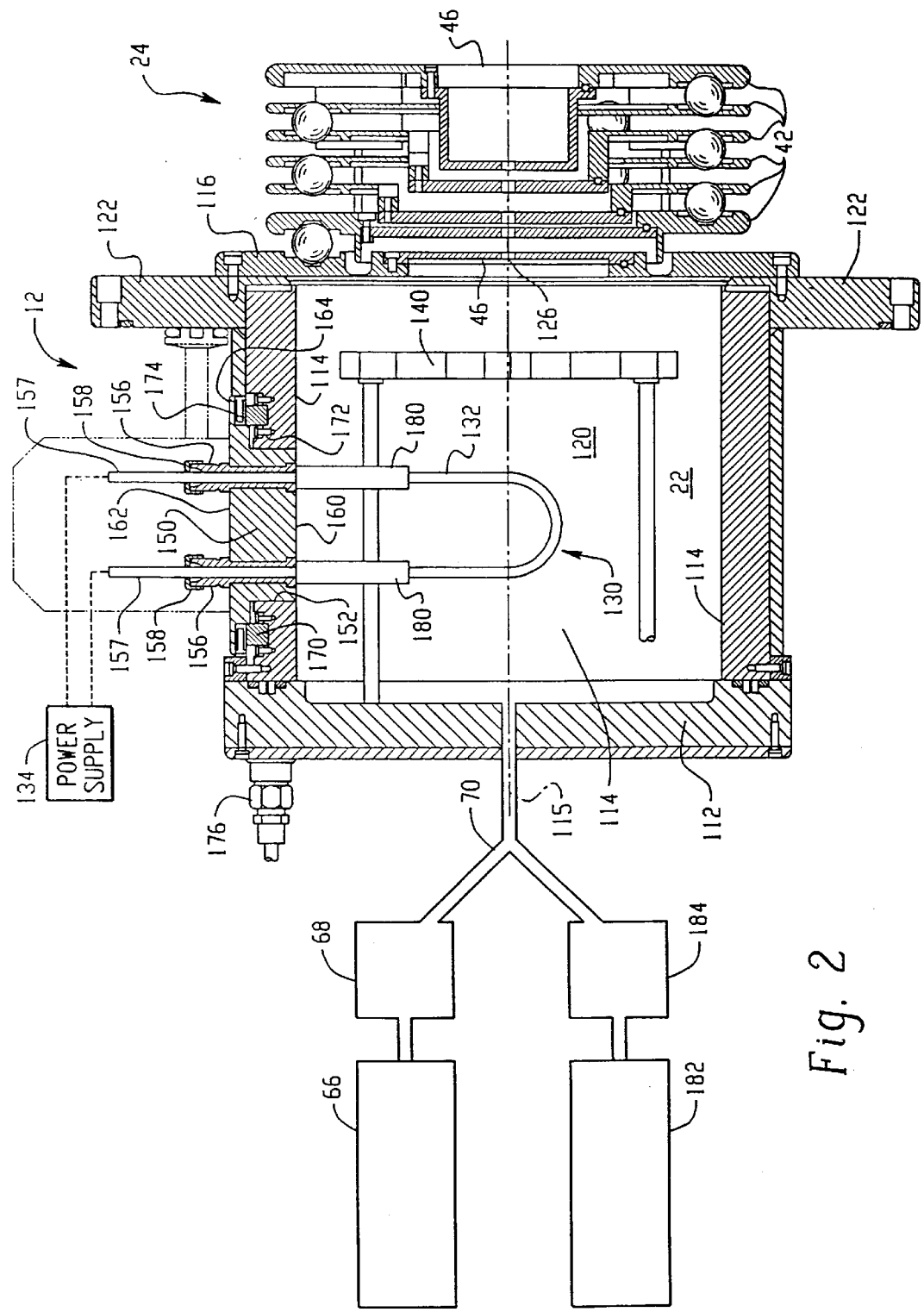
FIG. 2 is a cross sectional view of the ion source of the ion implantation system of FIG. 1.

The present invention is incorporated into the source 12 of the implanter 10 of FIG. 1, shown in greater detail in FIG. 2. Ionizable dopant gas, which is obtained either directly in the form of a source 66 of compressed gas is injected into the plasma chamber 22 by means of a mass flow controller 68 through conduit 70. Typical source elements are phosphorous (P) and arsenic (As). These source elements are often provided in gaseous form in combination with other elements, for example, phosphorous in the form of phosphine ($PH_3$), and arsenic in the form of arsine ($AsH_3$).

The plasma chamber 22 has electrically conductive chamber walls 112, 114, 116 that bound an ionization zone 120 in a chamber interior. The chamber walls provide an interior surface area of the plasma chamber in the preferred embodiment of approximately 2000 $cm^2$. Side wall 114 is circularly symmetric about a center axis 115 of the plasma chamber 22. A conductive wall 116 that faces the resolving magnet 14 is connected to a plasma chamber support 122. Wall 116 supports the aperture plate 46 having multiple openings that allow ions to exit the plasma chamber 22 and then combine to form the ion beam 44 at a location downstream from multiple spaced apart and electrically isolated extraction electrodes 24. The aperture plate 46 includes a number of openings arranged in a specified pattern that align with similarly configured multiple apertures in the spaced apart extraction electrodes 42. Only one such aperture is shown in the FIG. 2.

A metallic antenna 130 has a metal surface 132 exposed within the chamber interior for emitting energy into the plasma chamber 22. A power supply 134 outside the plasma chamber 22 energizes the metallic antenna 130 with a radio frequency (RF) signal of approximately 13.56 megahertz (MHz) to set up an alternating electric current in the metallic antenna that to induce an ionizing electric field within the plasma chamber 22. The power of the antenna is on the order of 500–3000 watts (W). The pressure in the source chamber is on the order of 1–10 millitorr. Accordingly, the source 12 is referred to as a low pressure, high-density inductive source. The plasma chamber 22 may also include a magnetic filter assembly 140 extending through a region of the chamber interior between the antenna 130 and the aperture plate 46.

The antenna 130 is positioned within the plasma chamber 22 by a removable support plate 150. The support plate 150 is supported by the side wall 114 at a location having a circular cutout 152 through which the antenna extends. A support plate 150 for the antenna 130 is sized to fit within the cutout 152 in the chamber wall 114 while positioning the exposed U-shaped metal portion 132 of the antenna 130 within the ionization zone 120.

The support plate 150 defines two through passageways that accommodate two vacuum pressure fittings 156. After elongated leg segments 157 of the antenna 130 are pushed through the fittings, end caps 158 are screwed onto the fittings to seal the region of contact between the fittings 156 and the leg segments 157. The antenna 130 is preferably U-shaped in its radiation-emitting region and is preferably constructed from aluminum. The tube has an outer diameter dimensioned to pass through the pressure fittings 156. While in use the antenna absorbs the heat from its surroundings. To dissipate this heat a coolant is routed through the center of the tube.

The plate 150 has a generally planar surface 160 that is exposed to an interior of the plasma chamber and includes a parallel outer surface 162 that faces away from the chamber interior. A flanged portion 164 of the plate 150 overlies a ring magnet 170 that surrounds the cutout in the wall 114 and that is attached to the wall 114 by connectors 172. A ferromagnetic insert 174 attached to the support plate 150 fits over the magnet 170 so that as the plate 150 is positioned within the cutout 152 the ferromagnetic insert 174 and the magnet 170 attract each other to secure the plate 150 in position with the antenna 130 extending into the chamber interior.

During operation of the ion source, heat is generated and this heat is absorbed by the walls 112, 114, 116, 118. The absorbed heat is removed from the chamber 22 by a coolant that is introduced through a fitting 176 for routing water into a passageway through the walls and away from the chamber by a second exit fitting (not shown). Accordingly, the temperature of the walls may be kept less than 100° C. As such, the ion source 12 is referred to as a cold walled ion source.

A region of the antenna 130 near the support plate 150 is particularly susceptible to coating with sputtered material during operation of the ion implanter. To minimize the effect of such sputtering, two shields 180 are slipped over the aluminum antenna before the antenna is inserted into the support plate 150. These shields are most preferably constructed from aluminum and are maintained in place by a friction fit between the shields and the outer surface of the exposed aluminum of the antenna 130.

During operation of the ion source 12, deposits of dopant elements may form on the interior walls 112, 114 and 116 that bound the ionization zone 120. For example, phosphorous (P) and arsenic (As) may form when phosphine ($PH_3$) and arsine ($AsH_3$), respectively, are run through the ion source. Accordingly, the present invention provides a mechanism for running a co-gas or cleaning gas simultaneously with the source gas while the ion source 12 is run under normal operating conditions. The mechanism for running the cleaning gas, such as nitrogen trifluoride ($NF_3$), is provided by a cleaning gas source 182 and a corresponding mass flow controller 184. The cleaning gas output of the mass flow controller 184 is combined with the source gas output of the mass flow controller 68 in conduit 70 prior to being delivered to the plasma chamber 22. Alternatively, the source gas and the cleaning gas may be delivered separately to the plasma chamber.

$NF_3$ will mostly disassociate into nitrogen and fluorine atoms, some of which will be negatively ionized in the plasma chamber 22. The fluorine atoms and ions react with the phosphorous (P) or arsenic (As) to prevent formation of these elements on the interior walls 112, 114 and 116 of the ion source when phosphine ($PH_3$) and arsine ($AsH_3$), respectively, are used as the source gas. Of course, the use of other source gases are contemplated, including but not limited to germane ($GeH_3$), germanium tetrafluoride ($GeF_4$), and diborane ($B_2H_6$). Regardless of the type of dopant gas, the fluorine atoms and ions assist in the removal of the deposits even as they are being formed. Thus, a separate cleaning step is avoided through the in-process use of a cleaning gas. By "in-process" it is understood that the cleaning process occurs while the ion implanter is undergoing normal production operation.

Figure 3:
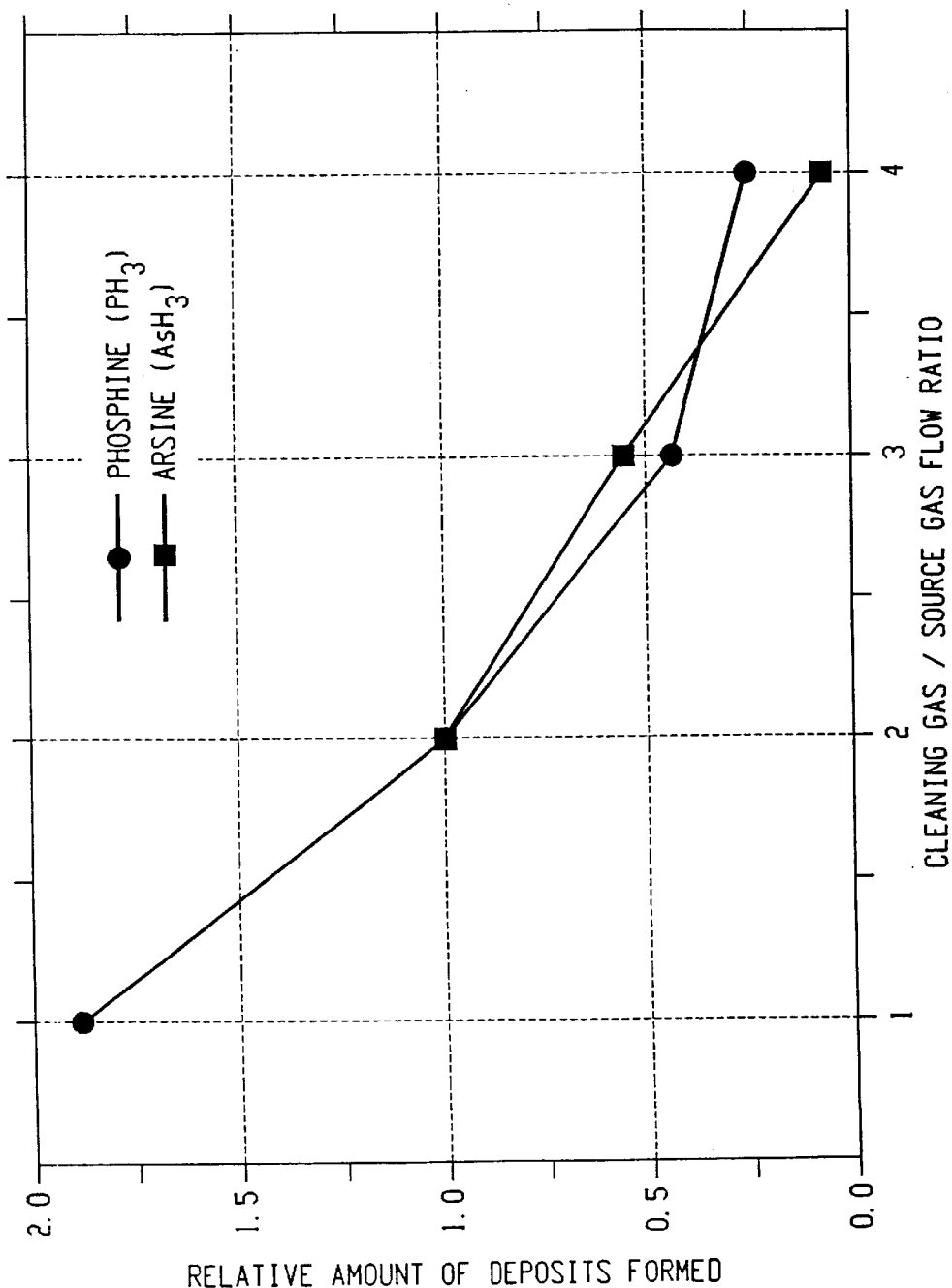
FIG. 3 is a graphical representation of deposit formation on the interior walls of the source of FIG. 2 as a function of the numerical ratio of cleaning gas to source gas.

FIG. 3 shows a graphical representation of deposit formation on the interior walls of the ion source of FIG. 2, as a function of the numerical ratio of cleaning gas to source gas, at a constant beam current for one hour. The mass flow controllers 68 and 184 can provide up to 10 standard cubic centimeters per minute (sccm) of the source gas and cleaning gas, respectively. In FIG. 3, the source gas is shown as either arsine or phosphine and the cleaning gas is nitrogen trifluoride. The amount of deposit along the vertical axis of FIG. 3 is normalized.

Typical flow rates are in the range of 5–10 sccm of $NF_3$ and 1–5 sccm of $AsH_3$ or $PH_3$. It is expected that the cleaning process will work effectively even at other gas flow ranges, RF power levels, and RF frequencies. Increasing the amount of $NF_3$ will improve the cleaning efficiency of the source but will require more energy input for the RF antenna, thereby reducing the operational efficiency of the source. At high $NF_3$ to source gas ratios (i.e., greater than 3:1), no significant dilution of the ion beam occurs as a result of the high concentration of $NF_3$ in the plasma chamber 22.

Figure 4:
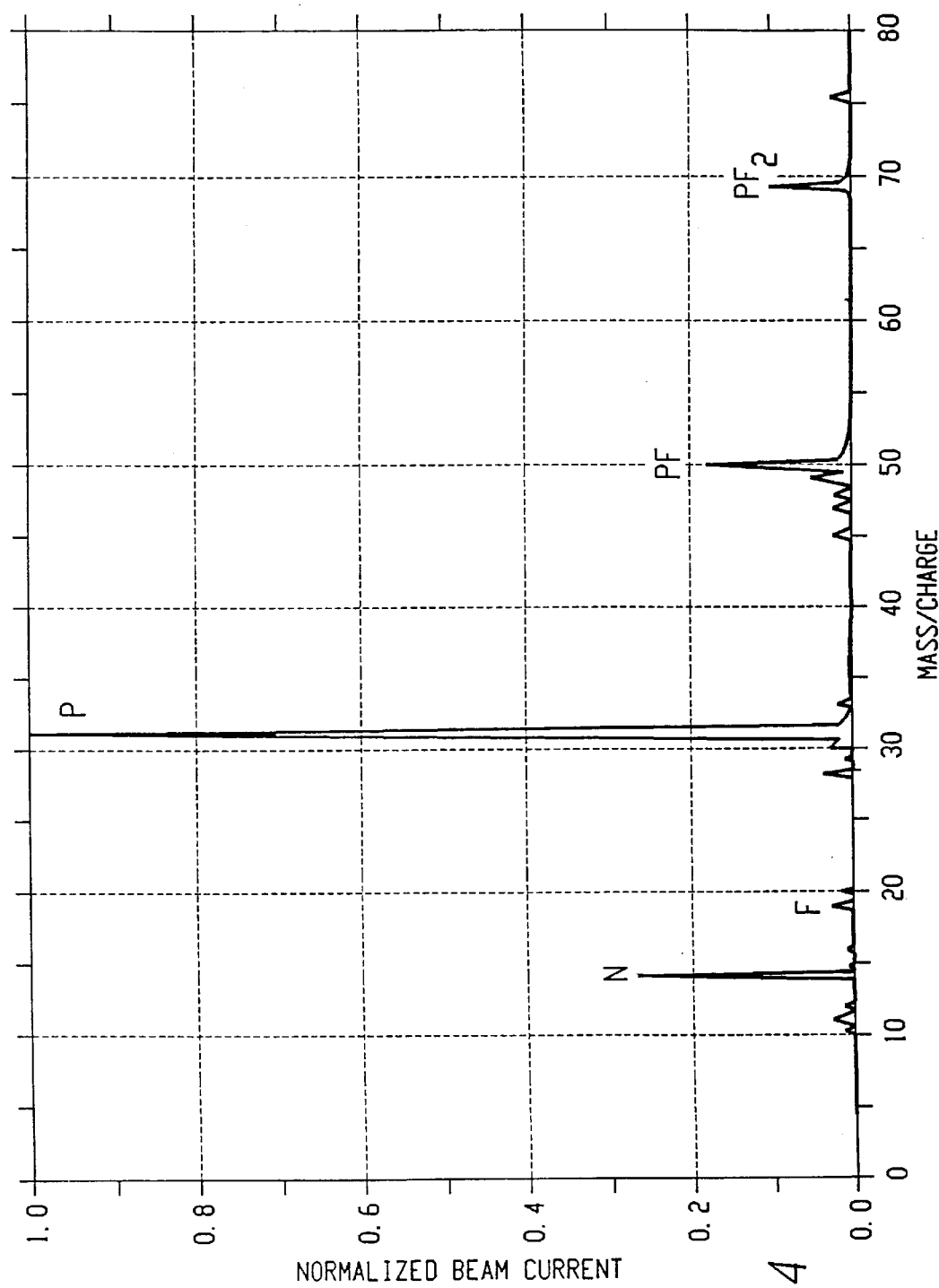
FIG. 4 is a graphical representation of the mass/charge spectrum of the ion beam current components using nitrogen trifluoride as a cleaning gas and phosphine as a source gas.
Figure 5:
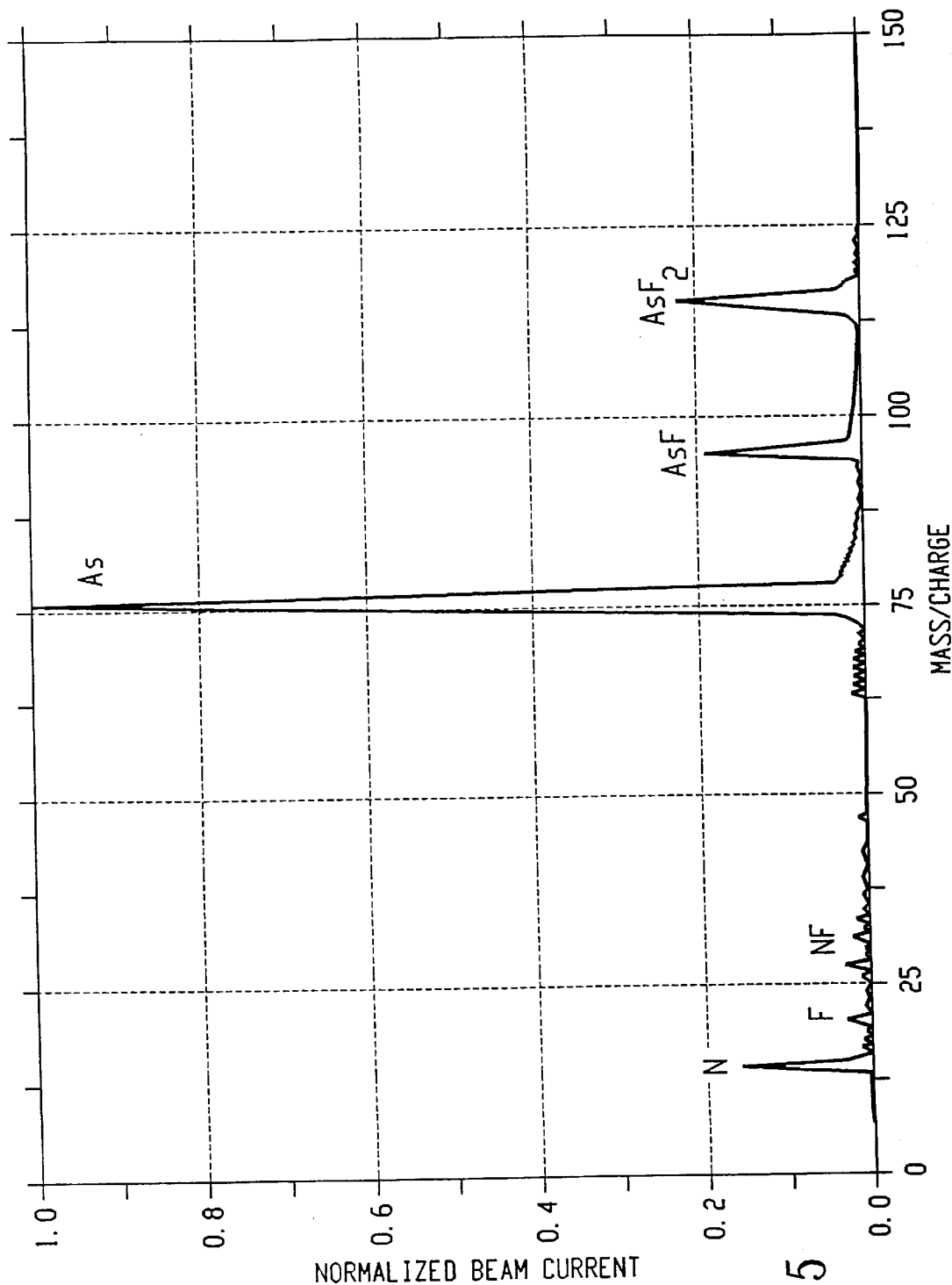
FIG. 5 is a graphical representation of the mass/charge spectrum of the ion beam current components using nitrogen trifluoride as a cleaning gas and arsine as a source gas.

FIGS. 4 and 5 show are graphical representation of the mass/charge spectrum of the ion beam current constituents (e.g., ions, atoms, molecules) using a ratio of four to one of nitrogen trifluoride as a cleaning gas and phosphine (FIG. 4) or arsine (FIG. 5) as a source gas. The graphical representations are obtained using a multi-channel mass spectrometer. As shown in FIG. 4, running $NF_3$ along with $PH_3$ (for phosphorous implants) results in atomic and molecular matter (N, F, PF, and $PF_2$) which otherwise would not be present in the plasma chamber 22. However, by tuning the mass analysis magnet 14 (refer back to FIG. 1), this unwanted atomic and molecular matter can be effectively filtered out of the beam. As shown in FIG. 5, running $NF_3$ along with $AsH_3$ (for arsenic implants) results in atomic and molecular matter (N, F, NF, AsF, and $AsF_2$) which otherwise would not be present in the plasma chamber 22. As in the case of FIG. 4, this unwanted atomic and molecular matter can be effectively filtered out of the beam by calibrating the mass analysis magnet 14, to remove from the beam particles of inappropriate charge to mass ratio.

Accordingly, a preferred embodiment of an ion source and a method of in-process cleaning of the source have been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. A method of in-process cleaning of an ion source (12) in an ion implanter (10) is provided, comprising the steps of:

positioning a substrate on a support (40);

introducing into a plasma chamber (22) of the ion source (12) an ionizable dopant gas (66);

introducing into said plasma chamber (22) a cleaning gas (182);

simultaneously exciting said ionizable dopant gas and said cleaning gas within said chamber to create a plasma comprised of disassociated and ionized constituents of said dopant gas and disassociated and ionized constituents of said cleaning gas; and (i) reacting said disassociated and ionized constituents of said cleaning gas with said disassociated and ionized constituents of said dopant gas to prevent formation of deposits of elements contained within said ionizable dopant gas on interior walls (112, 114, 116) of said chamber, while simultaneously (ii) extracting an ion beam (44) from the plasma chamber (22) for implantation into the substrate.

2. The method of claim 1, wherein said cleaning gas is nitrogen trifluoride ($NF_3$).

3. The method of claim 2, wherein said ionizable dopant gas is phosphine ($PH_3$), and said deposits of elements comprise phosphorous (P) deposits.

4. The method of claim 2, wherein said ionizable dopant gas is arsine ($AsH_3$), and said deposits of elements comprise arsenic (As) deposits.

5. The method of claim 2, wherein said cleaning gas and said ionizable dopant gas are introduced into said chamber (22) by mass flow controllers (68, 184).

6. The method of claim 5, wherein the ratio of cleaning gas (182) to ionizable dopant gas (66) introduced into said plasma chamber (22) is greater than 0:1.

7. The method of claim 6, wherein the ratio of cleaning gas (182) to ionizable dopant gas (66) introduced into said plasma chamber (22) is at least 3:1.

8. The method of claim 2, wherein the step of exciting said ionizable dopant gas and said cleaning gas within said chamber is effected by an RF antenna (130).

9. The method of claim 8, further comprising the step of water-cooling the RF antenna (130).

10. The method of claim 2, wherein said interior walls of said chamber walls are electrically conductive and are water-cooled.

* * * * *